United States Patent [19]

Bard et al.

[11] Patent Number: 4,846,929

[45] Date of Patent: Jul. 11, 1989

[54] WET ETCHING OF THERMALLY OR CHEMICALLY CURED POLYIMIDE

[75] Inventors: Steven L. Bard, Endwell; Claudius Feger, White Plains; John J. Glenning, Vestal; Gareth G. Hougham, Ossining; Steven E. Molis, Yorktown Heights; Walter P. Pawlowski, Endicott; John J. Ritsko, Mt. Kisco; Peter Slota, Jr.; Randy W. Snyder, both of Vestal, all of N.Y.

[73] Assignee: IBM Corporation, Armonk, N.Y.

[21] Appl. No.: 218,384

[22] Filed: Jul. 13, 1988

[51] Int. Cl.$^4$ .................. B44C 1/22; B29C 37/00; C23F 1/02; C03C 15/00

[52] U.S. Cl. .................. 156/630; 156/651; 156/655; 156/656; 156/659.1; 156/661.1; 156/668; 156/644; 252/79.2; 252/79.5; 427/307

[58] Field of Search .............. 156/630, 651, 655, 656, 156/659.1, 661.1, 668, 644; 252/79.2, 79.5; 427/307

[56] References Cited

U.S. PATENT DOCUMENTS 3,758,388  4/1973  Shotlon ............... 156/668 X
4,353,778  10/1982 Fineman et al. .......... 156/644
4,369,090  1/1983  Wilson et al. ........... 156/644
4,426,253  1/1984  Kreuz et al. ............ 156/668
4,431,478  2/1984  Yamaoka et al. ......... 156/668
4,624,740  11/1986 Abrams et al. .......... 156/643
4,639,290  1/1987  Leyden et al. .......... 156/644

FOREIGN PATENT DOCUMENTS 8700391  1/1987  PCT Int'l Appl. ......... 156/668

Primary Examiner—William A. Powell
Attorney, Agent, or Firm—Pollock, VAnde Sande & Priddy

[57] ABSTRACT

Polyimide is etched by contacting the polyimide with an aqueous solution of a metal hydroxide followed by contact with an acid followed by contact with an aqueous solution of a metal hydroxide. Etching of chemically cured polyimide can be enhanced by employing a presoaking in hot water. Also, partially etched chemically cured polyimide is removed with a concentrated acid solution.

In preparing a metal coated polyimide structure for subsequent gold plating, two flash etching steps with the polyimide etch between are employed after developing the photoresist.

37 Claims, No Drawings

WET ETCHING OF THERMALLY OR CHEMICALLY CURED POLYIMIDE

TECHNICAL FIELD

The present invention is concerned with etching a fully, or at least substantially fully thermally or chemically cured polyimide layer.

In particular, the present invention is concerned with a wet etching process for removing fully or at least substantially fully thermally or chemically cured polyimide.

In particular, the present invention is especially suitable for forming vias in thermally or chemically cured polyimide layers that separate metallic layers from each other to allow for selective metal connection between the separated metallic layers. Moreover, the present invention is useful to image polyimide which is used as a circuit carrier.

BACKGROUND ART

The selective etching of polyimide films to provide openings or vias therein is important for various uses of polyimide. For instance, in the packaging of semiconductor chips, substrates are often provided with polyimide layers.

In a number of these situations, it is necessary to form vias in the polyimide layer to allow for electrical connections to be made between the different layers of metallurgy. In order that the interconnection be as accurate as possible, it is necessary that the polyimide films be fully cured to avoid distortion of the desired polyimide pattern and prevent attack from other wet processing chemicals.

For instance, in the formation of multi-layer substrates for mounting chips, one configuration employs an insulating substrate of ceramic material onto which is deposited a pattern of metallic conductors. Usually, the conductors are three layers of metal being a layer of chromium or nickel, followed by a layer of copper, followed by an overlayer of chromium or nickel. On top of the metallized ceramic substrate is placed a film or layer of polyimide; on top of the polyimide a second layer of pattern conductors is provided. The conductors are generally three layers of metal being chromium or nickel, followed by copper, followed by chromium or nickel. It is necessary to electrically contact some of the conductors in the upper or second layer of metallization to some of the conductors on the lower or first layer of metallization. In order to do so, the polyimide must be selectively etched to form the desired vias therein to allow for metal connection between the upper and lower levels of metallization.

Another use would be as a dielectric and/or circuit carrier for flexible circuits. This would involve, for example, spray coating or roller coating polyamic acid onto a sheet of metal (such as stainless steel or aluminum). The film is then thermally cured or imidized, resulting in a film which is fully or substantially fully thermally cured. The metal which the polyimide is on can be imaged, removed, or maintained. On top of the polyimide, three layers of metal are deposited such as by either evaporation or sputtering. The conductors are chromium or nickel, followed by a layer of copper, followed by a layer of chromium or nickel. By means of photolithographic operations, this metal is imaged into circuits. Depending on the use of the circuit, the polyimide may or may not be imaged either before or after the formation of the circuit.

One technique for wet etching fully or substantially fully cured polyimide is using either hydrazine hydrate or ethylene diamine. Both are extremely dangerous chemicals and are avoided by industry wherever possible. Ethylene diamine is highly carcinogenic and hydrazine hydrate is highly unstable and extremely explosive. If used, both would have tools which are extremely expensive because of safety concerns.

Moderate or slightly thermally cured polyimide (significant amounts of polyamic acid remain) can be etched by using a metallic hydroxide. Etch time is dependent on etchant temperature and concentration, the films degree of cure (percent imidization), and film thickness.

In addition, chemically cured polyimide can be etched using relatively high concentrated hot potassium hydroxide such as about 8 to about 15 molar.

Furthermore, the by-products formed by the etching are somewhat difficult to remove.

Accordingly, methods to etch polyimides and especially fully or at least substantially fully cured polyimides have not been entirely satisfactory and could stand significant improvement.

SUMMARY OF INVENTION

The present invention provides a process for etching of fully cured or substantially fully cured polyimide that is relatively fast without requiring dangerous or explosive chemicals.

In particular, the process of the present invention comprises contacting a fully or at least substantially fully cured polyimide layer with an aqueous solution of metal hydroxide followed by contact with an acid, followed by contact with a metal hydroxide solution. A quick water rinse can be used to minimize the dragout of the chemicals from one bath to another which could cause the baths to neutralize each other and significantly decrease the bathlife. In addition, the etching processing does not adversely affect any metallic circuitry that might be present along with the photoresist material that might be employed to pattern the polyimide to provide the desired selective etching pattern for the polyimide.

According to another aspect of the present invention, when etching the chemically cured polyimides, relatively fast and uniform etching with a metallic hydroxide is achievable by presoaking the chemically cured polyimide in hot water, followed by etching in an aqueous solution of a metallic hydroxide.

In a further aspect of the present invention, when etching chemically cured polyimides, partially etched chemically cured polyimide is removed by employing a concentrated acid aqueous solution.

According to a further aspect of the present invention, the following sequence is employed to etch metallized polyimide structures. In particular, a polyimide substrate having on both major surfaces thereof a pattern of metal lines and relatively thin metal seed layer is provided on both sides with a photoresist. The photoresist is exposed and developed to define where the polyimide is to be subsequently etched. The seed metal is etched from those defined areas where the polyimide is to be subsequently etched, followed by etching of the polyimide. Next, the photoresist is removed and the remaining seed metal that was protected by this photoresist is then etched away.

BEST AND VARIOUS MODES FOR CARRYING OUT INVENTION

The etching process of the present invention is concerned with etching of fully or at least substantially fully cured polyimide. In particular, the fully or at least substantially fully cured polyimides etched pursuant to the present invention are those having a significant amount of ring closure from chemical and/or preferably from subsequent thermal treatment. In the preferred aspects of the present invention, the cured polyimide has about 100% imidization content.

The polyimides treated pursuant to the present invention can be the chemically cured or the thermally cured polyimides.

The difference between the thermally cured polyimide and chemically cured polyimide is the structure of the film. The heat treatment of the polyimide "packs" the polymer chains very closely together. This packing gives the thermally cured polyimide very good mechanical properties. This film is quite impervious to most chemical attacks. To be wet etched, a very aggressive process is required. Chemically cured polyimides (such as Kaptons) structure is different since the packing of the film is not nearly as dense as thermally cured polyimides. Therefore, the chemically cured polyimides can be etched with chemicals that are less aggressive than those needed or desired for the thermally cured polyimides.

The polyimides that can be etched in accordance with the present invention include unmodified polyimides, as well as modified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

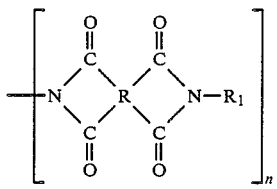

where n is an integer representing the number of repeating units to provide a molecular weight usually about 10,000 to about 100,000. R is at least one tetravalent organic radical selected from the group consisting of:

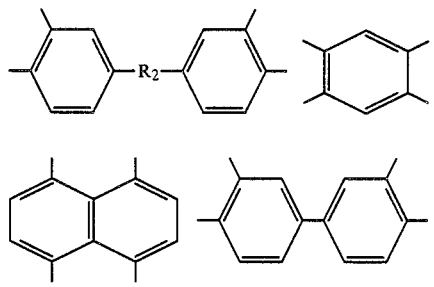

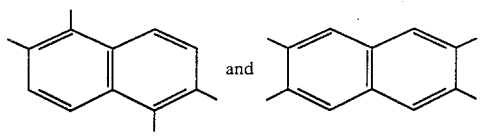

and $R_2$ being selected from the group consisting of divalent aliphatic hydrocarbon radicals having from 1 to 4 carbon atoms and carbonyl, oxy, sulfo, hexafluoroisopropylidene and sulfonyl radicals and in which $R_1$ is at least one divalent radical selected from the group consisting of:

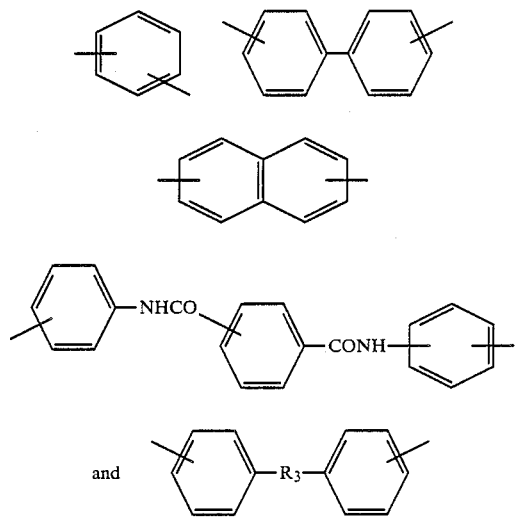

in which $R_3$ is a divalent organic radical selected from the group consisting of $R_2$, silico, and amino radicals. Polymers containing two or more of the R and/or $R_1$ radicals, especially multiple series of $R_1$ containing amido radicals, can be used.

Commercially available polyimide precursors (polyamic acid) and particularly various polyimide precursors from DuPont are available under the trade designation Pyralin. This polyimide precursor comes in many grades, including those available Pyralin polyimide precursors from DuPont under the further trade designations PI-2555, PI-2545, PI-2560, PI-5878, PIH-61454, and PI-2540. A number of these are Pyromelletic Dianhydride-Oxydianaline (PMDA-ODA) polyimide precursors.

Commercially available chemically cured polyimides are various polyimides from DuPont and available under the trade designation Kapton, including H-Kapton, V-Kapton, HN-Kapton, and VN-Kapton, which are all chemically cured polyimides. The chemically cured polyimides are generally cured with acetic anhydride and pyridine.

In order to obtain the thermally cured polyimides etched pursuant to the present invention, the polyimide precursors are subjected to elevated temperatures of at least about 250° C., preferably at least about 300° C., and most preferably at least about 350° C. The maximum temperature must not be greater than the breakdown temperature of the polyimide and depending upon the specific polyimide can be up to about 600° C. For many polyimides it is preferred that the temperature not be greater than about 485° C. The thermal cure is usually for at least about 15 minutes and preferably at least about 30 minutes.

It is understood that the present invention is concerned with etching fully or at least substantially fully cured polyimides as distinguished from partially cured polyimides that include only about 20% to about 70% imidization.

The first step of the process of the present invention is to contact the preselected areas of the polyimide to be etched with an aqueous solution of a metal hydroxide and particularly an aqueous solution of an alkali metal hydroxide such as potassium hydroxide or sodium hydroxide. The concentration of the hydroxide is usually at least about 4 molar and preferably about 4 to about 15 molar. In addition, in the preferred aspects of the present invention, up to about 15% by volume and preferably about 3% to about 15% by volume of N-methyl-2-pyrrolidone is employed along with the hydroxide. The N-methyl-2-pyrrolidone enhances the speed of the etching process and the sharpness of the etched image.

The etching with the hydroxide bath is usually carried out from about 1 to about 5 minutes and preferably about 2 to about 3 minutes (depending upon the thickness of the film to be etched). The bath is generally at a temperature of about 60° C. to about 100° C.

Next, the polyimide is contacted with a strong, inorganic or organic acid such as hydrochloric acid, sulfuric acid, or acetic acid. When an aqueous solution of the acid is employed, usually the concentration of the acid is at least about 1 molar, preferably at least about 3 molar, and most preferably about 3 to about 8 molar. The treatment with the acid is usually carried out in about 1 to about 5 minutes at temperatures of about room temperature or above.

The polyimide is then contacted with an aqueous hydroxide solution like the first hydroxide bath for another 1 to 5 minutes and preferably about 2 minutes. This is done to complete the etching process. In between the base and acid baths, it is desirable to have a quick water rinse to minimize bath neutralization due to chemical dragout.

In addition, if desired, the polyimide after the etching can then be rinsed with hot water such as water at about 95° C.for about 1 to about 5 minutes and preferably for a 2 minutes. This is then followed by a dilute acid bath to neutralize any residual base on the surfaces of the structure. This is then followed by another water rinse.

By following the etching procedure of the present invention, about 10 microns of fully and substantially fully thermally cured polyimide can be etched in about the total of 5 to 6 minutes.

The above process is most advantageous for etching the thermally cured polyimides as contrasted to chemically cured polyimides which do not require the very aggressive etching characteristics achieved by the above process. In some instances, with chemically cured polyimides, this etching is too strong and will not allow proper formation of the interlevel connection or the carrier's image in chemically cured polyimides.

According to another aspect of the present invention, etching of chemically cured polyimide in an aqueous solution of a metallic hydroxide can be carried out in a relatively fast and uniform manner by presoaking the chemically cured polyimide in hot water, followed by the etching in the aqueous solution of the metallic hydroxide. The use of this presoak, however, is not effective with thermally fully cured polyimides. The temperature of the water for the presoak is usually about 55°–95° C. and preferably about 70°–95° C., and usually for at least about 30 seconds and preferably about 1½ to about 2½ minutes; the time being dependent, to some extent, upon the film thickness. For instance, a 2 minute soak is quite adequate for a 2 mil thick film.

This process aspect of the present invention increases the etch rate of the chemically cured polyimide by about a factor of 2. The hot water quickly heats up and swells the chemically cured polyimide. The swelling permits a quicker penetration of the hydroxide with the film, while the increased temperature raises the reaction rate.

In addition, this process aspect of the present invention drastically improves the uniformity of the etch.

Moreover, since the films to be etched are contacted with the hydroxide etchant for lesser periods of time, etch back or undercutting, as previously experienced, is significantly reduced. Also, in view of reduction in time whereby the films are exposed to the hydroxide, products will be more reliable. For instance, any metal hydroxide that is absorbed in the film and not rinsed out will leach out of the film onto its surface. The longer the contact with the hydroxide, the more likely that some will remain on the films.

When a bias is put across a circuit, those ionic contaminants will either cause the circuitry to corrode or migrate, causing an inline failure.

The contact with the alkali metal hydroxide is usually about 2 to about 3 minutes and preferably about 2½ minutes for about 2 mil thick films. It is usually at a temperature of about 75° C. to about 95° C. The preferred hydroxide is potassium hydroxide. The concentration is usually at least about 4 molar and preferably about 6.7 to about 6.8 molar.

In addition, when etching the chemically cured polyimides, partially etched polyimide often remains, forming what has been referred to as "spider webs". It has been found, in accordance with the present invention, that such partially etched polyimide can be removed without forming new partially etched polyimide by contacting with an inorganic acid such as hydrochloric acid or sulfuric acid. When chromium is also present, the acid employed is sulfuric acid since hydrochloric acid will attack the chromium. The acids generally have a concentration of about 20% volume to about 70% volume, typical being 22% volume to about 25% volume.

This processing is usually carried out at about 75° C. up to the boiling point of the acid composition and preferably about 80° C. and taking from about 3 to about 10 minutes.

In various structures that employ cured polyimides, copper lines are present thereon which, in turn, are plated with gold for subsequent soldering procedures. However, during the etch of the polyimide with, for example, hot caustic, oxidation of the copper tends to occur. If the oxidation is excessive, it becomes difficult, if not impossible, to remove all of the oxide. This, in turn, prevents the plating of the gold. Pursuant to this aspect of the present invention, gross copper oxidation is eliminated. In addition, as will be discussed, "etch back" of the polyimide is decreased, as well as achieving improved adhesion of the photoresist. This aspect of the present invention also allows for an inspection of the quality of the lamination of the photoresist.

In a typical arrangement involving this aspect of the present invention, a polyimide substrate, such as about 2 mils thick, having on each major surface thereof a seed layer of chromium, typically about 200 angstroms, followed by a seed layer of copper, typically about 800 angstroms.

A positive photoresist is then applied, exposed, and developed to provide a desired pattern for the subsequently to be plated, relatively thick copper.

Typical positive photoresists are based on phenol formaldehyde novolak polymers. A particular example of such is Shipley AZ-1350, which is an m-cresol formaldehyde novolak polymer composition. Such is a positive resist composition and includes therein diazoketone such as 2-diazo-1-naphthol-5-sulphonic acid ester. In such a composition, the orthodiazoketone, during the photochemical reaction, is converted to a carboxylic acid. This, in turn, converts a neutral-organic soluble molecule (the phenolic polymer) to one that is readily soluble in weakly alkali aqueous developer solvents. The composition usually contains about 15% or so, by weight, of the diazoketone compound. Another commercially available positive photoresist employed is Dynachem UF.

After development of the photoresist, copper is plated by well-known techniques in those areas on both sides of the substrate where the photoresist has been removed. The thickness of the copper being typically about 1.1 mils to about 1.4 mils. After plating up of the copper in the desired pattern, the remaining positive photoresist is removed.

Next, another photoresist is provided, preferably by lamination, typically about 1-2 mils thick. This photoresist is used for the subsequent steps of removing seed metal layers between the patterned plated copper. Since the photoresist does not conform identically with the patterned copper, there will exist regions that are free of material between the photoresist and copper lines. However, since seed metals are still present at this stage on the polyimide surface adjacent the copper lines, such will act as an etch barrier to prevent etch back of the lines in subsequent etching steps of the polyimide. It is preferred that this photoresist layer be a negative resist.

Examples of some photoresists employed according to the present invention include negative or photohardenable polymerizable compositions of the type suggested in U.S. Pat. Nos. 3,469,982; 3,526,504; 3,867,153; and 3,448,098; and published European patent application No. 0049504, disclosures of which are incorporated herein by reference. Polymers from methylmethacrylate and from glycidyl acrylate and/or from a polyacrylate such as trimethylol propane triacylate and pentaerythritol triacrylate are commercially available from E. I. DuPont de Nemours and Company under the trade designation "Riston".

Examples of some negative photoresists employed according to the present invention are from polymethylmethacrylates such as those commercially available from E. I. DuPont de Nemours and Company under the trade designations "Riston T-168" and "Riston 3515". "Riston T-168" is a negative photoresist material from polymethylmethacrylate and crosslinkable monomeric units such as from trimethylol propane triacrylate. A detailed discussion of preparing a negative resist from polymethylmethacrylate, trimethylol propane triacrylate, and trimethylene glycol diacetate can be found in Example 1 of U.S Pat. No. 3,867,153. "Riston 3515" is a negative photoresist material which is developable in an aqueous medium. Examples of aqueous developable negative photoresists are described in published European patent application No. 0049504 such as Example 23 thereof, disclosure of which is incorporated herein by reference. A typical resist described therein is from a copolymer of methylmethacrylate, ethyl acrylate, and acrylic acid, and a copolymer of styrene and maleic anhydride isobutyl ester.

By employing this particular sequence of steps, the resist will be provided on only copper, as contrasted to the prior art whereby the resist is laminated only after the seed metals have been removed and, therefore, are laminated to mainly polyimide with some copper lines present. The adhesion of the resist to copper is significantly greater, for instance, about ten times greater, than it is to the polyimide.

Problems of resist delamination from the polyimide have been observed, but not from the copper. Furthermore, in the case of the prior process, if the resist delaminates from the polyimide, the etch carrier is broken and the etchant will attack all of the polyimide. This cannot occur in the present invention because the seed metal is still present.

Furthermore, if a problem exists at the laminator where the laminator does not properly laminate the resist, it will be clearly visible prior to the polyimide etch. On the other hand, a gap or poor lamination between the resist and polyimide is not readily seen.

The resist is then exposed to the desired pattern, imaged, and then developed by removal of the unexposed seed material by dissolution in an appropriate liquid in the case of a negative resist. When this resist is Riston T-168, it can be developed employing methylchloroform or 1,1,1-trichloroethane.

A critical distinction of this present invention over the prior art is employing a flash etch step at this point in the process.

The flash etch is to remove only the seed metal from those locations where polyimide is to be subsequently etched and still leave seed metal adjacent copper lines to avoid the etch back. The flash etch for removing copper can be a ferric chloride, cupric chloride, or potassium persulfate aqueous solution, typically about 0.1 to about 5.0 molar, such as about 0.1 molar solution of ferric chloride for about 15 seconds to about 180 seconds, typical of which is about 45 seconds at temperatures of about ambient to about 65° C., typical of which is 30° C.

The flash etch for the chromium layer can employ a solution of about 10 grams/liter to about 200 grams/liter, typical of which is 60 grams/liter of potassium permanganate, and about 0.1 molar to about 5.0 molar, typical of which is about 0.5 molar NaOH. This etch is carried out at about ambient to about 70° C., typical of which is about 39° for about 15 seconds to about 240 seconds, typically about 90 seconds (dependent on metal thickness).

Next, the exposed polyimide is etched such as using a potassium hydroxide solution of at least 4 molar and preferably about 6.7-6.8 molar.

The resist is then removed by dissolution in an appropriate solvent. For example, the exposed Riston T-167 can be removed with methylene chloride.

After this, the remaining seed copper and chromium is removed by a second flash etch of the types discussed above.

The structure is now ready for the gold plating.

In order to facilitate a further understanding of the present invention, the following non-limiting examples are presented:

EXAMPLE 1

A 10 micron thick film of polyimide which is roller coated in the form of polyamic acid onto a stainless steel sheet of metal and cured at about 350° C. for about 30 minutes is immersed in an aqueous solu of 9 molar potassium hydroxide containing about 5% by volume of N-Methyl-2-Pyrrolidone at about 95° C. for about 4 minutes. The polyimide is removed from the potassium hydroxide bath and then immersed in 3 molar aqueous hydrochloric acid bath at room temperature for about 1 minute. The polyimide is then removed from the acid bath and is again immersed in the 9 molar aqueous potassium hydroxide bath containing about 5% by volume N-Methyl-2-Pyrrolidone for an additional 2 minutes. The 10 microns of polyimide are removed by this etching.

EXAMPLE 2 A 10 micron thick film of an H-Kapton film that is fully cured by heating to about 350° C. for about 30 minutes is immersed in an aqueous solution of about 9 molar potassium hydroxide containing about 5% by volume of N-methyl-2-pyrrolidone at 195° F. for about 3 minutes. The polyimide is removed from the hydroxide bath and then immersed in an aqueous 3 molar HCl solution at room temperature for about 1 minute. The polyimide is then removed from the acid solution and again immersed in the first hydroxide bath for an additional 2 minutes. The etching removes the exposed 10 microns of polyimide.

EXAMPLE 3

A 10 micron thick film of polyimide of the same type employed in Example 1 is immersed in an aqueous solution of 9 molar potassium hydroxide at about 195° for about 4 minutes. The polyimide is removed from the potassium hydroxide bath and then immersed in a 3 molar aqueous HCl bath for about 1 minute at room temperature. The polyimide is then removed from the acid bath and again immersed in the 9 molar aqueous potassium hydroxide bath for an additional 2 minutes. The results obtained are similar to those of Example 1, except that the process takes somewhat longer because of the absence of the N-methyl-2-pyrrolidone in the potassium hydroxide bath.

EXAMPLE 4

A 10"×15" panel of 2 mil thick Type HN Kapton is provided with a 200 angstrom chromium adhesion layer (on both sides), a 10,000 angstrom seed layer of copper (on both sides) on top of the chromium, and a copper circuitry image pattern plated on both sides to 1.4 mils thick.

The panel is laminated on both sides with 2 mil thick T-168C negative photoresist. This resist is vacuum laminated with a plate temperature of 95° C. Both sides are then exposed to the desired mask pattern using the total spectrum of a mercury lamp with an exposure energy of 60 millijoules per squar centimeter. The image is then developed using methylchloroform for 2 minutes at 65° C. to remove the unexposed resist.

The parts are subjected to 2 metal flash etches to remove the base seed layer in the windows or areas for subsequent etching of the Kapton.

First, the copper is etched by using 0.1 molar ferric chloride at about 30° C. for about 45 seconds. This is followed by a chrome etch using about 60 grams per liter of potassium permanganate and about 0.5 molar sodium hydroxide at about 39° for about 90 seconds. This is followed by a room temperature, 2 molar oxalic acid rinse.

The panel is now ready for Kapton etch. The panel is subjected to a 95° water presoak for about 2.5 minutes. This is followed by a 6.7 molar, 95° C. potassium hydroxide etch for about 3.5 minutes. The parts are then subjected to a 95° post caustic water rinse for about 2.5 minutes. To remove any redeposited, partially etched Kapton, the panels are immersed in an 80° C., 22% (by volume) sulfuric acid bath for about 4.5 minutes. The panel is then rinsed in a deionized water overflow (5 GPM) rinse for at least 20 minutes and then air dried.

The resist is then stripped off using methylene chloride at ambient temperature for 10 minutes.

The above metal flash etches are repeated to remove the seed metal which is under the photoresist.

Having thus described our invention, what we claim as new and desire to secure by Letters Patent is:

1. A process for etching a fully cured or substantially fully cured polyimide layer which comprises contacting said polyimide layer with an aqueous solution of a metal hydroxide, followed by contact with an acid, followed by contact with an aqueous solution of metal hydroxide.

2. The process of claim 1 wherein said hydroxide is an alkali metal hydroxide.

3. The process of claim 1 wherein said hydroxide is sodium hydroxide, potassium hydroxide, or mixtures thereof.

4. The method of claim 3 wherein the concentration of said hydroxide is at least about 4 molar.

5. The method of claim 3 wherein the concentration of said hydroxide is about 4 to about 15 molar.

6. The method of claim 1 wherein the concentration of said hydroxide is at least about 4 molar.

7. The method of claim 1 wherein the concentration of said hydroxide is about 4 to about 15 molar.

8. The method of claim 1 wherein the solution of metal hydroxide contains up to about 15% by volume of N-Methyl-2-Pyrrolidone.

9. The method of claim 8 wherein the amount of N-Methyl-2-Pyrrolidone is about 3% to about 15% by volume.

10. The method of claim 1 wherein the solutions of metal hydroxide are employed at temperatures of about 60° C. to about 100° C.

11. The method of claim 1 wherein said acid is hydrochloric acid, acetic acid, sulfuric acid, or mixtures thereof.

12. The method of claim 1 wherein at least about 1 molar aqueous solution of said acid is employed.

13. The method of claim 1 wherein at least about 3 molar aqueous solution of said acid is employed.

14. The method of claim 1 wherein about 3 to about 8 molar aqueous solution of said acid is employed.

15. The method of claim 1 wherein said polyimide is heat cured polyimide that was heated to temperatures of at least about 350° C., but not greater than about 485° C. for at least about 30 minutes.

16. The method of claim 1 wherein said hydroxide is potassium hydroxide and said acid is hydrochloric acid.

17. The method of claim 1 wherein said acid is an inorganic acid.

18. The method of claim 1 wherein said acid is an organic acid.

19. A process for etching a chemically cured polyimide layer which comprises contacting said polyimide layer with water at a temperature of about 55° C. to about 95° C. for a time sufficient to increase the etch rate of the polyimide and thereafter contacting said polyimide with an etchant to thereby etch said polyimide.

20. The process of claim 19 wherein said temperature is about 70° C. to about 95° C., 21. The process of claim 19 wherein said time is at least about 30 seconds.

22. The process of claim 19 wherein said etchant is an aqueous solution of a metallic hydroxide.

23. The process of claim 22 wherein said hydroxide is an alkali metal hydroxide.

24. A process for removing partially etched chemically cured polyimide by contacting with an inorganic acid.

25. The process of claim 24 wherein said acid is sulfuric acid.

26. The process of claim 25 wherein the concentration of said acid is about 20% to about 70% by volume.

27. The process of claim 25 wherein the concentration of said acid is about 22% to about 25% by volume.

28. The process of claim 25 wherein the temperature of said acid is about 75° C. up to the boiling point thereof.

29. A process for etching metallized polyimide structures which comprise:
providing a polyimide substrate having on both major surfaces a pattern of metal lines and relatively thin metal seed layer;
providing a photoresist on said metal seed layer;
exposing and developing said layer to define those areas where polyimide is to be subsequently etched;
flash etching said seed metal from those areas where the polyimide is to be subsequently etched;
stripping said photoresist; and flash etching the remaining seed metal that was protected by the photoresist.

30. The process of claim 29 wherein said photoresist is a negative photoresist and is laminated onto said metal seed layer.

31. The process of claim 29 wherein said metal seed layer is copper on top of chromium.

32. The process of claim 29 wherein said polyimide is chemically cured polyimide and is etched with an alkali hydroxide solution.

33. The process of claim 32 wherein said polyimide is etched by contacting said polyimide with water at a temperature of about 55° C. to about 95° C. for a time sufficient to increase the etch rate of the polyimide and thereafter contacting said polyimide with an etchant to thereby etch said polyimide.

34. The process of claim 33 wherein partially etched polyimide is removed by contacting with an inorganic acid.

35. The process of claim 34 wherein said acid is sulfuric acid.

36. The process of claim 29 which further includes coating metal lines on the polyimide substrate with gold.

37. The process of claim 29 wherein said polyimide layer is thermally cured polyimide layer and is etched by contacting said polyimide layer with an aqueous solution of a metal hydroxide, followed by contact with an aqueous solution of an acid, followed by contact with an aqueous solution of metal hydroxide.

* * * * *